United States Patent
Schenker et al.

(10) Patent No.: US 9,201,125 B2
(45) Date of Patent: Dec. 1, 2015

(54) DEVICE FOR THE CONTINUOUS QUALITY CONTROL OF APPLIED ELEMENTS

(75) Inventors: Thomas Schenker, Zofingen (CH); Beat Von Aesch, Schoenenwerd (CH); Thomas Liebi, Rothrist (CH)

(73) Assignee: Muller Martini Holding AG, Hergiswil (CH)

( * ) Notice: Subject to any disclaimer, the term of this patent is extended or adjusted under 35 U.S.C. 154(b) by 475 days.

(21) Appl. No.: 13/242,466

(22) Filed: Sep. 23, 2011

(65) Prior Publication Data
US 2012/0086447 A1  Apr. 12, 2012

(30) Foreign Application Priority Data
Oct. 8, 2010  (CH) .................................. 1651/10

(51) Int. Cl.
*G01R 33/09* (2006.01)
*B42B 4/00* (2006.01)
*B82Y 25/00* (2011.01)

(52) U.S. Cl.
CPC ................ *G01R 33/093* (2013.01); *B42B 4/00* (2013.01); *B82Y 25/00* (2013.01)

(58) Field of Classification Search
CPC .......... B42B 4/00; B65H 37/04; B82Y 25/00; G01R 33/093
USPC ................ 324/200, 207.11, 207.13, 207.21, 324/207.22, 244, 252, 67, 326, 329
See application file for complete search history.

(56) References Cited

U.S. PATENT DOCUMENTS

| | | | | |
|---|---|---|---|---|
| 5,296,807 A | * | 3/1994 | Kousek et al. | 324/235 |
| 5,543,708 A | * | 8/1996 | Stauber | 324/133 |
| 6,124,712 A | * | 9/2000 | Chaiken | 324/326 |
| 6,456,093 B1 | * | 9/2002 | Merkel et al. | 324/640 |
| 6,933,717 B1 | * | 8/2005 | Dogaru et al. | 324/239 |
| 7,194,892 B2 | * | 3/2007 | Frohlich | 73/32 R |
| 7,595,633 B2 | * | 9/2009 | Martin et al. | 324/179 |
| 2010/0134095 A1 | * | 6/2010 | Loreit et al. | 324/207.2 |

FOREIGN PATENT DOCUMENTS

| | | |
|---|---|---|
| DE | 3817024 A1 | 3/1989 |
| DE | 10 2007 029 819 A1 | 1/2009 |
| EP | 0 205 144 A2 | 12/1986 |
| EP | 1 029 443 A2 | 8/2000 |

(Continued)

OTHER PUBLICATIONS

Sergey A. Titov, Roman Gr. Maev, Alexey N. Bogachenkov, Pulse-echo NDT of adhesively bonded joints in automotive assemblies, Ultrasonics, vol. 48, Issues 6-7, Nov. 2008, pp. 537-546.*

(Continued)

*Primary Examiner* — Huy Q Phan
*Assistant Examiner* — James Split
(74) *Attorney, Agent, or Firm* — Venable LLP; Robert Kinberg; F. Brock Riggs

(57) ABSTRACT

A method for continuous quality control of geometric, structural and functional parameters of an applied element, such as a staple, in printed products. The quality control is realized with the aid of at least one measuring device that comprises at least one measuring head including at least one permanent magnet and at least one giant magneto resistance sensor chip. The applied element is detected with the measuring head and, based thereon, a magnetic image is generated of the condition of the element.

12 Claims, 4 Drawing Sheets

(56) References Cited

FOREIGN PATENT DOCUMENTS

| | | | | | |
|---|---|---|---|---|---|
| EP | 1 591 272 A1 | | 11/2005 | | |
| JP | 05131774 A | * | 5/1993 | ................ | B42B 4/00 |
| JP | 10054808 A | * | 2/1998 | ............. | G01N 22/00 |
| JP | 2008093838 A | * | 4/2008 | | |
| JP | 2010082803 A | * | 4/2010 | | |
| JP | 2010188680 A | * | 9/2010 | | |
| JP | 2011068478 A | * | 4/2011 | | |
| WO | WO-01/17863 | | 3/2001 | | |

OTHER PUBLICATIONS

International Search Report Dated Jan. 28, 2011 of CH 16512010 With an English Translation.

* cited by examiner

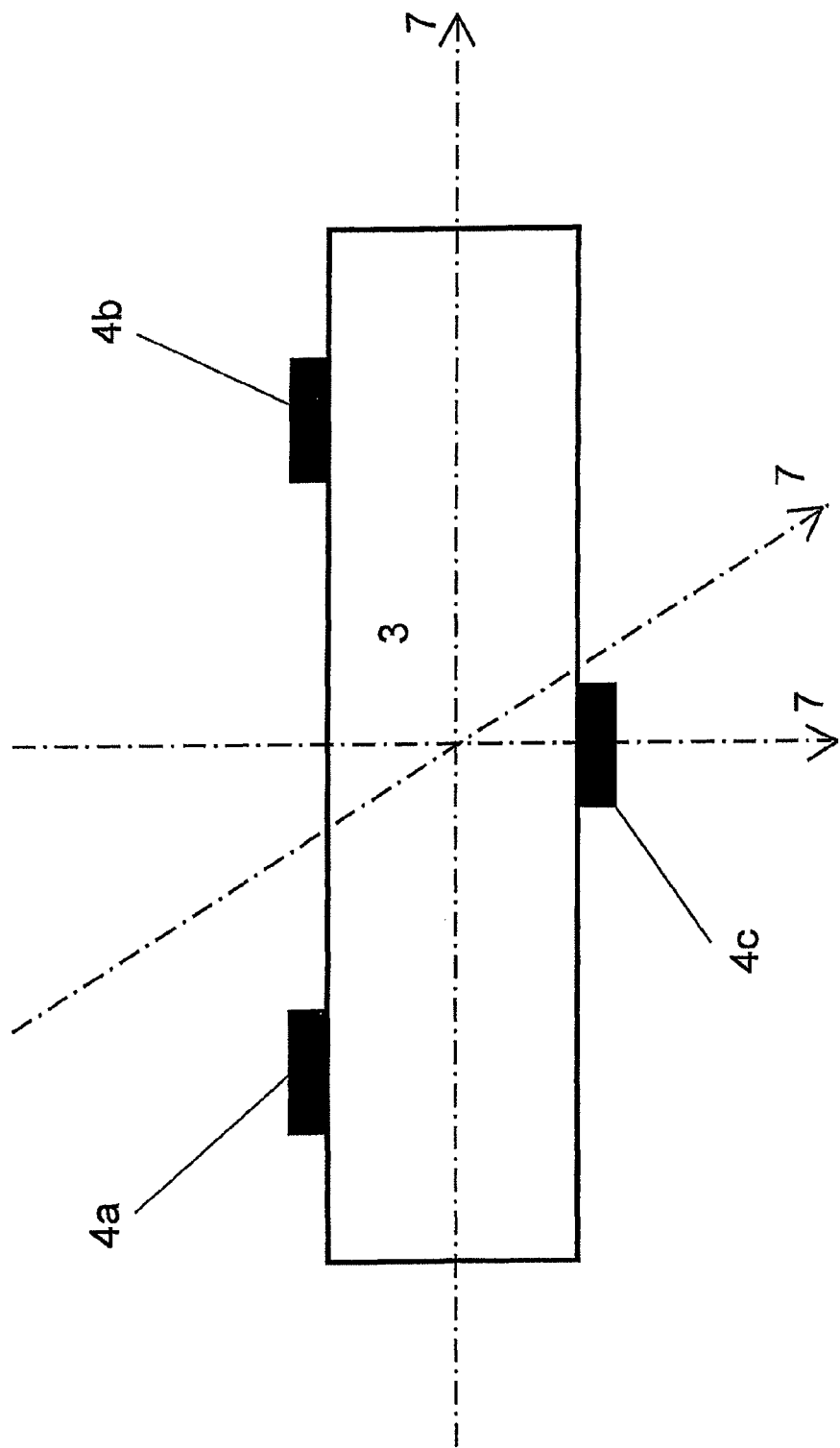

DEVICE FOR THE CONTINUOUS QUALITY CONTROL OF APPLIED ELEMENTS

CROSS-REFERENCE TO RELATED APPLICATION

This application claims the priority of Swiss Patent Application No. 01651/10, filed on Oct. 8, 2010, the subject matter of which is incorporated herein by reference in its entirety.

BACKGROUND OF THE INVENTION

The present invention relates to a method for continuous quality control of an applied element, such as a staple, with respect to the geometrical, structural and functional parameters of the element. The invention furthermore relates to a measuring device for realizing the method.

As is known, printed products are frequently stitched together with wire staples, wherein a wire-stitching machine is used for this purpose. Wire-stitching machines comprise respectively one stitching head and one bending device for carrying out the stitching operation. This stitching operation involves feeding in a wire, cutting off a section of wire, forming the staple, punching the staple legs through of the product to be stitched and bending over of the two staple legs.

Methods and devices are furthermore known from the prior art which make it possible to check for the presence of staples in a product, so as to remove products with a missing staple. A check of this type can be realized with a metal detector, for example, which is arranged in the transport direction downstream of the wire-stitching machine. Each staple passing through triggers a pulse, wherein a missing pulse is an indication of a missing staple in a product.

A device for detecting a missing staple with the aid of a sensor arranged on a wire-stitching machine is furthermore known from European patent document EP 0 205 144, wherein the sensor is embodied as a proximity switch or as an optical sensor.

However, the aforementioned methods and devices can only be used to check whether a stitching took place, but not the quality of a stitching operation. The method consequently also indicates defective staples as being present or inserted, for example staples having a leg that is projecting outward. Defective stapling operations of this type are undesirable because they can result in injuries to the user and/or the reader of the printed product. Numerous measures have therefore already been proposed according to the prior art for detecting such defective stapling operations and for removing the respective printed products.

European patent document EP 1 029 443 A discloses a device for monitoring the stitching of products, wherein a measuring means is arranged on the wire-stitching machine that is designed to detect changes in the state of a bending device or in a stitching head of the wire-stitching machine which punches the staples through the product. The aforementioned measuring means is embodied, for example, as strain gauges used to detect the force generated during the forming of the staple at the bending device. If this force deviates from a predetermined value, it is assumed that the stitching is faulty and the product is correspondingly removed via the machine control. As a result, the stitching operation in the wire-stitching machine is checked in this case which does not, however, allow drawing conclusions relating to the effective processing of the staple.

A method is furthermore known from European patent document EP 1 591 272 A1 for which the measuring apparatus respectively checks the density course of a staple which is passing through. In the case of defective staples, for example if a leg projects outward or is missing, the density course deviates considerably from that of a faultlessly inserted staple. A faultlessly inserted staple comprises both legs and these are bent as specified, so that generally there is no danger of injury. Other defects in a stitching operation can also be detected with this method, for example even if the staple is a so-called eyelet staple and if the eyelet of the staple is defective, meaning it is bent. This quality-assurance control substantially depends on the degree of resolution of the sensor that is used, especially during the operation.

A method for controlling wire-stitching operations is also known from European document DE 38 17 024 A1. The goal of this method is to increase the quality of the items to be processed and to lower the amount of waste material. A signal image of a wire-stitching operation of a desired product is generated with the aid of a plurality of measuring points, wherein the image is subsequently stored. For quality control, a point-by-point comparison is made with signal values for the wire-stitching of actual products, wherein a faulty wire-stitching is signaled for difference values outside of specified tolerance limits between the desired condition and the actual condition. It is noteworthy for this document that the means for realizing the described pushing direction are summarily mentioned. Thus, with respect to the prior art it is only mentioned therein that an inductive sensor is used for the metal items. Later on in the document, only a sensor is mentioned.

The following facts can therefore be deduced from the prior art:

A coil used for determining the geometric condition of the staple has proven to be too large, so that an approach to the object for a better resolution remains difficult.

Taking the path of using an inductive coil also did not bring the desired success, even though some improvement could be achieved because of the relative miniaturization of the coil. However, the desired resolution could still not be achieved.

The degree of the resolution is thus for the most part predetermined by the physical limits of the sensor that is used.

SUMMARY OF THE INVENTION

It is an object of the invention to remedy the above described problems.

The above and other objects are achieved according to the invention wherein according to an embodiment there is provided a method for continuous quality control of geometric, structural and functional parameters of an applied element of soft magnetic material and between the applied element and a base product, comprising: detecting the applied element using at least one measuring device including at least one measuring head comprising at least one permanent magnet presenting a constant magnetic field and at least one giant magneto resistance (GMR) sensor chip; and generating a magnetic image of the applied element based on results of the detecting step.

According to another embodiment, there is provided a measuring device for realizing a method for continuous quality control of geometric, structural and functional parameters of an applied element of soft magnetic and between the applied element and a base product, comprising: a measuring head including a permanent magnet having a longitudinal extension and opposite sides, and at least one giant magneto resistance sensor chip arranged on both sides in the longitudinal direction of the permanent magnet, wherein the sensor chips are arranged symmetrically or asymmetrically in the direction of the longitudinal extension of the permanent magnet and/or along a section through which the applied element passes.

With a method and a device of the aforementioned type, better resolution of the configuration of the applied element to be measured or detected may be obtained, thereby ensuring a maximized quality control. In principle, the quality of the applied element is checked by obtaining as precise an image of the element as is possible. On the one hand, the detected electronic images of the applied elements can be used to detect the desired state of these elements, meaning to create a so-called reference image. An actually detected image then can be compared to a reference image and a pass/fail assessment may be carried out by evaluating a deviation.

According to an embodiment, a sensor module may be provided with an integrated signal amplifier, which consists of a combination of at least one permanent magnet and one giant magneto resistance (GMR) sensor chip. For the operation, the sensor module is installed such that it can be positioned as close as possible to the element moving past it.

The GMR effect is observed in structures composed alternately of magnetic and non-magnetic thin layers with a layer thickness in the nanometer range. These structures can be used for producing measuring apparatus (sensor chips) which change their electrical conductivity based on the magnetic field intensity.

These findings have not yet been applied to the process of checking the qualitative specifications for staples since the opinion among relevant circles so far has been that the solutions offered by the prior art are totally sufficient or the opinion has prevailed that it would be difficult in any case to arrive at better solutions, owing to the filigree design of such a staple and because of the high clocking rates for conveying printed products bound with staples.

The intricate structures of staples can, in principle, also be found in other elements for which the quality must also be checked continuously and at high clocking rates, in particular if such elements have a functional effect relative to the base product and if this quality control in particular results in an essential acceptance of the product itself.

Thus, if the use of the present invention is focused on a better understanding of the inventive solution as it relates to staples, it is not intended as a prejudicial restriction relative to other applicable products. The focus on staples in this case is tied to the fact that the use of these staples makes it possible to show the essential aspects of the invention in a comprehensive manner.

The mode of operation for the sensor module according to the invention is as follows:

The permanent magnet generates a magnetic field in the region of the staple which is passing by. The staple, comprised of soft-magnetic material in this case, in reaction generates its own magnetic field which is super-imposed on the constant field of the permanent magnet. The GMR sensor chips measure the field intensity difference at two points located close to each other (gradient) and, in the process, provide a corresponding analogous voltage signal which allows inferring the shape of the magnetic field. Deviations in the signal course make it possible to draw conclusions relating to the quality, meaning to the condition of the applied staples, or in general to the condition of the elements used. These deviations can then be used for the efficient detection of the actual condition of these elements, wherein the underlying quality tolerance is of course also taken into consideration.

An advantage of the invention may therefore be seen in the high degrees of freedom, relative to the element to be measured or detected, which result from the miniaturization of the GMR sensor chip and which makes possible the effective, integral detection of the applied element, primarily because the measuring head can be moved very close to the element, even under difficult conditions.

Further, combination of several GMR sensor chips may be provided which jointly permit forming a precise image, as seen from several perspectives of the per se filigree configured element. It is also possible to link signals from the GMR sensor chips so that individual aspects of the detected element can be purposely emphasized and can then be imaged, wherein the image is a magnetic reproduction.

Further advantageous embodiments may be discerned from the following detailed description.

BRIEF DESCRIPTION OF THE DRAWINGS

These and other features and advantages of the invention will be further understood from the following detailed description considered with reference to the accompanying drawings.

FIG. 4 shows an optional arrangement of the GMR sensor chips.

DETAILED DESCRIPTION

Figure 1:
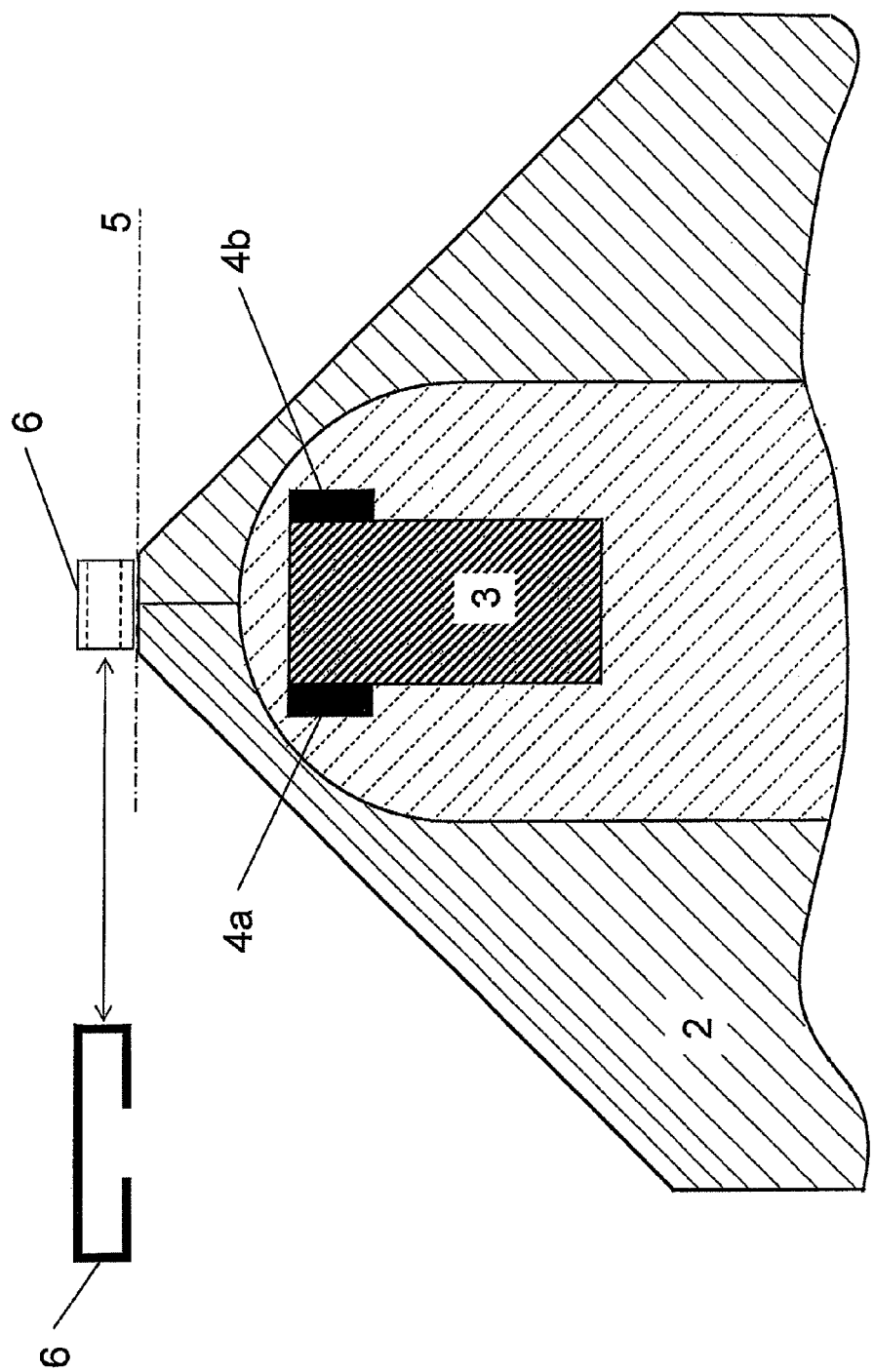
FIG. 1 shows a cross section through a measuring head comprising a permanent magnet with two giant magneto resistance (GMR) sensor chips arranged on the sides.

With reference to FIG. 1, there is shown an embodiment of a measuring head 2 inside a wire-stitching machine 1. The measuring head 2 includes a permanent magnet 3 that is complemented with two GMR sensor chips 4a and 4b. These two GMR sensor chips 4a, 4b are attached on opposite sides of the permanent magnet 3. Located above the measuring head 2 is the plane 5 for the wire staples 6 which are magnetically imaged by the measuring head 2. It should be taken into consideration that for specific printed products, the gathering and wire-stitching machines operate at clocking rates higher than 16,000, wherein this is intended to demonstrate the requirements that must be met for a high-quality measuring operation.

The permanent magnet 3, which is preferably injection-molded integrally with the measuring head 2, generates a magnetic excitation for the staple 6 passing. The staple, in this case made of a soft-magnetic material, in reaction generates a magnetic field which is super-imposed onto the constant field of the permanent magnet. The GMR sensor chips 4a, 4b respectively measure the field intensity difference at two points which are close together (gradient) and, in the process, generate a corresponding analogous voltage signal which makes it possible to infer the shape of the magnetic field. Deviations in the signal course allow drawing conclusions as to the quality, meaning the condition of the inserted staples 6. These conclusions are subsequently used for an efficient detection of staples 6 which do not meet the quality tolerance requirements. The magnetic force acts upon the staple which is then attracted toward the permanent magnet when using standard materials. The imaging of the staple with the aid of two chips then requires a mathematical process if an absolute symmetry is missing.

All geometrical, structural and functional parameters of the wire staple 6 can be detected with this method and by including the magnetic image generated with the measuring head 2. That is, it may be determined:

(a) whether the staple is inserted at the correct location;
(b) whether the two staple legs have penetrated uniformly and parallel to each other the printed product to be stitched;
(c) whether the two legs of the staple were bent evenly;
(d) whether the two legs of the staple were bent as specified and whether they fit absolutely flat relative to the inside fold of the printed product, thus preventing any danger of injury.

The measuring head 2 can furthermore be used to generate information not just relating to the above-mentioned conventional staples. The so-called eyelet staples can also be detected equally well, wherein for this detection and the magnetic imaging, in particular, high requirements must be met because the geometry and structure of such an eyelet staple is distinctly more complicated than is the case for a conventional staple.

The measuring head 2 has a high further development potential relating to the measuring operation and the magnetic imaging since additional GMR sensor chips can be installed which are responsible, for example, only for some aspects of the quality control. The high degree of miniaturization of the measuring head 2 furthermore permits a successive arrangement of several measuring heads 2 which can then be operatively connected with respect to the measuring technology.

Figure 2:
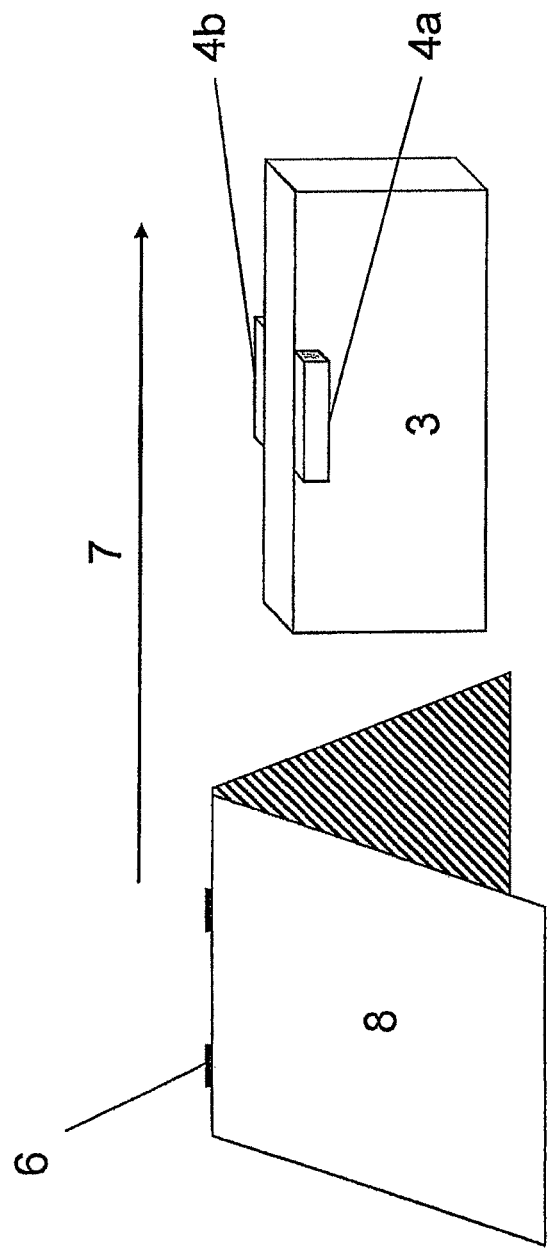
FIG. 2 shows a representation of the mode of operation of the GMR sensor chip in the product movement direction.

FIG. 2 shows a mode of operation for the underlying magnetic imaging of the inserted staples, as seen in a product movement direction 7. However, the size ratio of printed sheet 8 to measuring head 2 is strongly tilted in favor of the measuring head 2 and in no way reflects the actual conditions. For this, we point to FIG. 1 which shows the close approach of the measuring head 2 to the plane for the staples 6.

FIG. 2 shows that the GMR sensor chips 4a, 4b are arranged on both sides of the permanent magnet, wherein the length of the permanent magnet points in the movement direction of the inserted staple. In the ideal case, the staple moves in the longitudinal direction of the permanent magnet, in the center between the respectively laterally arranged GMR sensor chips 4a, 4b which comprise at least one measuring point. If the GMR sensor chips 4a, 4b are respectively provided with two or more measuring points, then possible distortions in the system can generally also be detected. Two or more GMR sensor chips 4a, 4b can also be provided on each side of the permanent magnet, wherein these can be arranged successively one behind the other and can furthermore be embodied with differing resolutions. The GMR sensor chips 4a, 4b furthermore need not be arranged symmetrical to each other. The goal of determining the position of the individual GMR sensor chips 4a, 4b, relative to each other, is on the one hand the maximizing of the resolution and, on the other hand, the detection of the integral, geometric configuration of the inserted staple in order to obtain a multi-dimensional image. By making possible a more flexible positioning of the GMR sensor chips 4a, 4b along and on both sides of the permanent magnet, it can be achieved that several measuring positions are created with respect to the source of the magnetic field, wherein these measuring positions make it possible to detect a three-dimensional signal of the applied element, for example the above described staple. As a result, it is also possible to show in particular the deformation on the side, transverse to the movement direction, of these staples.

With specific configurations or set-ups for the measuring head 2 relative to the measuring method, it is also possible to arrange the measuring elements transverse to the movement direction.

In summary, it can be said that the use of the above described measuring head 2 will maximize the quality-related detection rate for the element to be measured or detected.

Figure 3:
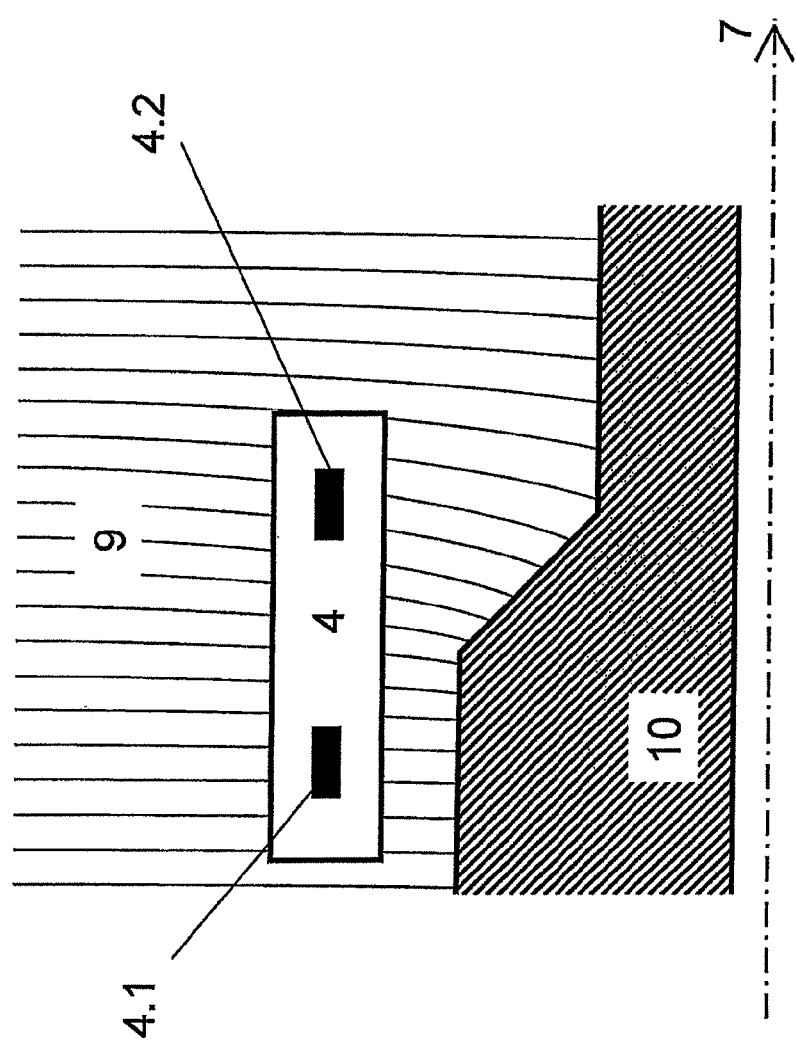
FIG. 3 is a diagram showing the measuring principle when using a GMR sensor chip.

FIG. 3 shows the measuring principle using a GMR sensor chip: The GMR sensor chip 4 has two measuring points 4.1, 4.2 which are arranged at a specific distance to each other. The resistance elements on the GMR sensor chip, which react to the magnetic field intensity 9, are interconnected to form a Wheatstone bridge (full bridge). This resistance measuring bridge provides a signal that is proportional to the gradient of the field intensity, meaning it is a gradient sensor and/or magnetic field differential sensor.

Differently embodied GMR sensor chips are available which essentially differ in the distance between the measuring points. The distances are optimized for the scanning of repeating structures, such as is normally the case for staples. Structures of this type also occur with distance measurements.

The goal of the principle according to the invention is to image the structure of soft-magnetic parts and/or staples with enough precision, so that deviations in the quality relating to the form or shape can be securely detected. FIG. 3 shows how the originally homogeneous magnetic field is distorted by the soft-magnetic element moving past it.

A slightly different field intensity is consequently generated at the two measuring points 4.1 and 4.2. Corresponding to the field intensity difference, the GMR sensor chip provides a positive or negative voltage signal that is proportional to this difference, wherein this voltage signal must then be electronically amplified for the evaluation.

The GMR sensor chips used for this application are in combination with a support magnet (permanent magnet) which generates a static magnetic field. The homogeneous field (located in the region where the measurement takes place) is distorted by the soft-magnetic element 10 which moves past. According to FIG. 3, the greatest amount of distortion is visible in particular along the edges and flanks.

FIG. 4 shows a possible arrangement for the GMR sensor chips: A permanent magnet in principle can be provided with one or several GMR sensor chips 4a, 4b and 4c. However, the sensor chips preferably should be attached at a location where the magnetic field in a plane is as homogeneous as possible. That is to say, the difference in the field intensity should be equal to zero in the idle state where no soft-magnetic element is in the sphere of influence. This is best achieved with an arrangement in the center region of a longitudinal edge. The magnetic field intensity in the region of the GMR sensor chip must be configured according to the characteristic for the GMR sensor chip so that an optimum working point for the sensor is created.

The GMR sensor chips must be arranged in a fixed position relative to the permanent magnet which is the source for the magnetic excitation. The GMR sensor chips are therefore arranged directly on the permanent magnet, along one edge. As a result of this arrangement along one edge, the GMR sensor chip is located as close as possible to the soft-magnetic element to be detected. The surface of the aforementioned magnet and the narrow fronts of the GMR sensor chips are thus positioned in one plane and form the surface of the complete measuring head which normally must be protected with a housing wall (as thin as possible), not made of a soft-magnetic material, against external mechanical influences.

For a permanent magnet that is embodied as a cuboid, the soft-magnetic element to be detected is advantageously guided along a longitudinal or transverse axis 7. It is furthermore conceivable to guide the product at an angle to the axis, provided this results in advantages for a specific geometry for use.

The following aspects are important for the quality control of staples. The housing shape, which resembles a pitched roof (see FIG. 1), is predetermined by the geometric layout for the discharge following the stitching head. A long, narrow cuboid shape may be selected for the permanent magnet, so that the magnet can be embedded optimally into the pitched-roof contour and/or so that the complete measuring system comes to rest as close as possible underneath the housing surface and is located as close as possible to the staple. Two GMR sensor chips are respectively arranged in the center of the longitudinal edge. This type of arrangement makes sense because the staple, which is guided along the longitudinal axis over the measuring head, is a measuring object having a symmetrical form. If only one chip were provided on the side, no useful image could be obtained.

The precise guidance of the measuring object is essential for the success of the method. The staples should always be guided in the center and along the surface of the stitching head. Variations in the distance to the stitching head are critical for the measuring operation. These framework conditions, however, are also decisive for the inductive method so that this basis can be considered a precondition.

It will be understood that the above description of the present invention is susceptible to various modifications, changes and adaptations, and the same are intended to be comprehended within the meaning and range of equivalents of the appended claims.

What is claimed is:

1. A measuring device for realizing a method for continuous quality control of geometric, structural and functional parameters of an applied element of soft magnetic material and between the applied element and a base product, comprising:
   a measuring head including:
      a permanent magnet having a longitudinal axis and opposite sides extending parallel to the longitudinal axis; and
      at least one giant magneto resistance sensor chip attached on each of the opposite sides of the permanent magnet, each of the giant magneto resistance sensor chips being configured to generate a signal representing information relating to at least one of the geometric, structural and functional parameters of the applied element that is at least partially embedded in the base product,
   wherein the giant magneto resistance sensor chips are arranged symmetrically or asymmetrically about the longitudinal axis of the permanent magnet and/or along a section of the permanent magnet through which the applied element passes, and
   wherein the signal of each giant magneto resistance sensor chip is linked with the signal of at least one other of the giant magneto resistance sensor chips to form an image of the applied element based on different perspectives of the applied element from the giant magneto resistance sensor chips.

2. The measuring device according to claim 1, wherein the giant magneto resistance sensor chips are arranged transverse to a movement direction of the applied element.

3. The measuring device according to claim 1, wherein a number of the giant magneto resistance sensor chips differs on each of the opposite sides of the permanent magnet.

4. The measuring device according to claim 1, wherein the giant magneto resistance sensor chips are positioned differently on each of the opposite sides.

5. The measuring device according to claim 1, wherein at least two giant magneto sensor chips arranged opposite to each other on the opposite sides of the magnet carry out a complementary measurement or detection.

6. The measuring device according to claim 1, wherein the giant magneto sensor chips comprises a plurality of measuring points.

7. The measuring device according to claim 1, wherein the measuring head has a top plane substantially defined by the giant magneto resistance sensor chips and the permanent magnet.

8. A method for continuous quality control of geometric, structural and functional parameters of an applied element of soft magnetic material and between the applied element and a base product, comprising:
   detecting the applied element using at least one measuring device according to claim 6, the permanent magnet presenting a constant magnetic field; and
   generating a magnetic image relating to at least one of the geometric, structural, and functional properties of the applied element that is at least partially embedded in the base product based on results of the detecting step.

9. The method according to claim 8, wherein the applied element is a wire staple or a eyelet staple and the base product is a printed product, and the detecting step includes using the measuring device to measure the applied staple and the generating step generates a magnetic image of the staple.

10. The method according to claim 8, further including guiding the applied element past the permanent magnet, and wherein the detecting step includes generating with the permanent magnet a magnetic excitation in the element guided past it, whereby the applied element reacts by generating a magnetic field which is super-imposed on the constant field of the permanent magnet, and wherein the detecting step further includes measuring with the giant magneto resistance sensor chips a field-intensity difference at two points located close to each other and supplying a corresponding analogous voltage signal which allows inferring a shape of the magnetic field, whereby a deviation in signal course represents information relating to the geometric, structural and functional parameters of the applied element.

11. The method according claim 10, further comprising making a mathematical evaluation if there is an asymmetric passage of the staple past the permanent magnet.

12. The method according to claim 10, further comprising comparing the generated magnetic image of the applied element to a reference image for a desired state to assess deviations between the images and making a pass/fail assessment by evaluating at least one of the deviations.

* * * * *